United States Patent
Yamada et al.

[11] Patent Number: 6,094,738
[45] Date of Patent: *Jul. 25, 2000

[54] TEST PATTERN GENERATION APPARATUS AND METHOD FOR SDRAM

[75] Inventors: Osamu Yamada, Tokorozawa; Koji Hara, Fujisawa, both of Japan

[73] Assignee: Advantest Corp., Tokyo, Japan

[*] Notice: This patent is subject to a terminal disclaimer.

[21] Appl. No.: 09/121,954

[22] Filed: Jul. 24, 1998

Related U.S. Application Data

[63] Continuation-in-part of application No. 08/894,870, Aug. 12, 1997, Pat. No. 5,854,801.

[30] Foreign Application Priority Data

Sep. 6, 1995 [WO] WIPO .......................... PCTJP9501767

[51] Int. Cl.$^7$ ..................................................... G01R 31/28
[52] U.S. Cl. ........................... 714/738; 714/742; 714/743; 714/718
[58] Field of Search ..................................... 714/738, 742, 714/743, 718, 720; 365/201; 324/158.1, 73.1; 341/55

[56] References Cited

U.S. PATENT DOCUMENTS 5,854,801  12/1998  Yamada et al. ........................ 714/738

FOREIGN PATENT DOCUMENTS 0847060  6/1998  European Pat. Off. .

*Primary Examiner*—Hoa T. Nguyen
*Attorney, Agent, or Firm*—Muramatsu & Associates

[57] ABSTRACT

A test pattern generation apparatus and method for an SDRAM can easily generate a test pattern for a synchronous dynamic RAM (SDRAM) by having a specific wrap conversion circuit or an address conversion method. The wrap conversion circuit is provided to receive two types of address data from a pattern generator and converts the data through a specified logic circuit information. The test pattern generation method for the SDRAM is carried out by inputting column address data and wrap address data, and by generating output data which has been converted by a predetermined logic equation. The test pattern generation apparatus and method can also include an address inversion scramble for the converted output.

10 Claims, 6 Drawing Sheets

| | 11 | 10 | 9 | 8 | 7 | 6 | 5 | 4 | 3 | 2 | 1 | 0 |
|---|---|---|---|---|---|---|---|---|---|---|---|---|
| Row | X11 | X10 | X9 | X8 | X7 | X6 | X5 | X4 | X3 | X2 | X1 | X0 |

| | 8 | 7 | 6 | 5 | 4 | 3 | 2 | 1 | 0 |
|---|---|---|---|---|---|---|---|---|---|
| Column | Y8 | Y7 | Y6 | Y5 | Y4 | Y3 | Y2 | Y1 | Y0 |

Wrap Address

| Order | In | | | | | | Gate | | | | | | | | | Out | | |
|---|---|---|---|---|---|---|---|---|---|---|---|---|---|---|---|---|---|---|
| | Y2 | Y1 | Y0 | Z2 | Z1 | Z0 | 101 | 102 | 103 | 104 | 105 | 106 | 107 | 108 | 109 | Y02 | Y01 | Y00 |
| ↓ | 0 | 1 | 0 | 0 | 0 | 0 | 0 | 0 | 1 | 0 | 0 | 1 | 0 | 0 | 0 | 0 | 1 | 0 |
| | 0 | 1 | 0 | 0 | 0 | 1 | 1 | 0 | 1 | 0 | 0 | 1 | 0 | 0 | 0 | 0 | 1 | 1 |
| | 0 | 1 | 0 | 0 | 1 | 0 | 0 | 0 | 0 | 1 | 0 | 0 | 0 | 1 | 1 | 1 | 0 | 0 |
| | 0 | 1 | 0 | 0 | 1 | 1 | 1 | 0 | 0 | 1 | 0 | 0 | 0 | 1 | 1 | 1 | 0 | 1 |
| | 0 | 1 | 0 | 1 | 0 | 0 | 0 | 0 | 1 | 0 | 1 | 1 | 0 | 0 | 1 | 1 | 1 | 0 |
| | 0 | 1 | 0 | 1 | 0 | 1 | 1 | 0 | 1 | 0 | 1 | 1 | 0 | 0 | 1 | 1 | 1 | 1 |
| | 0 | 1 | 0 | 1 | 1 | 0 | 0 | 0 | 0 | 1 | 1 | 0 | 0 | 1 | 0 | 0 | 0 | 0 |
| | 0 | 1 | 0 | 1 | 1 | 1 | 1 | 0 | 0 | 1 | 1 | 0 | 0 | 1 | 0 | 0 | 0 | 1 |

| Order | In | | | | | | Gate | | | Out | | |
|---|---|---|---|---|---|---|---|---|---|---|---|---|
| | Y 2 | Y 1 | Y 0 | Z 2 | Z 1 | Z 0 | 201 | 202 | 203 | Y 2 | Y 1 | Y 0 |
| ↓ | 0 | 1 | 0 | 0 | 0 | 0 | 0 | 1 | 0 | 0 | 1 | 0 |
| | 0 | 1 | 0 | 0 | 0 | 1 | 1 | 1 | 0 | 0 | 1 | 1 |
| | 0 | 1 | 0 | 0 | 1 | 0 | 0 | 0 | 0 | 0 | 0 | 0 |
| | 0 | 1 | 0 | 0 | 1 | 1 | 1 | 0 | 0 | 0 | 0 | 1 |
| | 0 | 1 | 0 | 1 | 0 | 0 | 0 | 1 | 1 | 1 | 1 | 0 |
| | 0 | 1 | 0 | 1 | 0 | 1 | 1 | 1 | 1 | 1 | 1 | 1 |
| | 0 | 1 | 0 | 1 | 1 | 0 | 0 | 0 | 1 | 1 | 0 | 0 |
| | 0 | 1 | 0 | 1 | 1 | 1 | 1 | 0 | 1 | 1 | 0 | 1 |

Fig.5
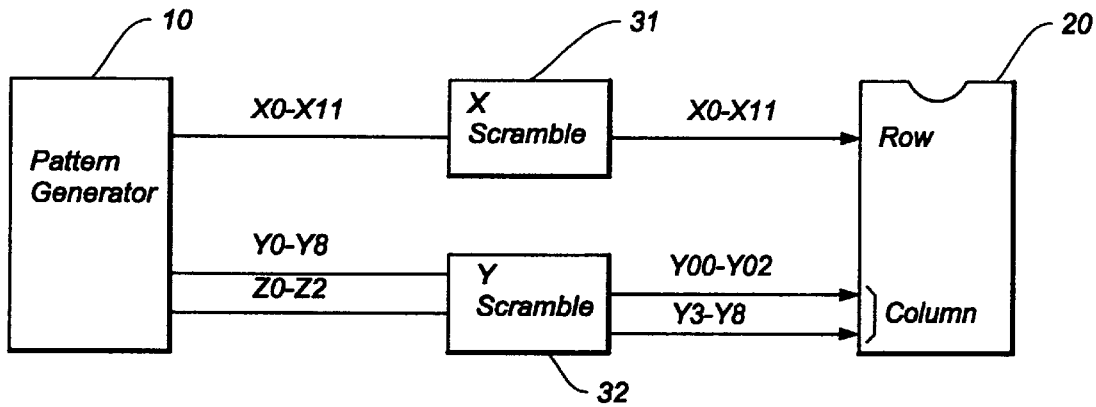
Fig.6
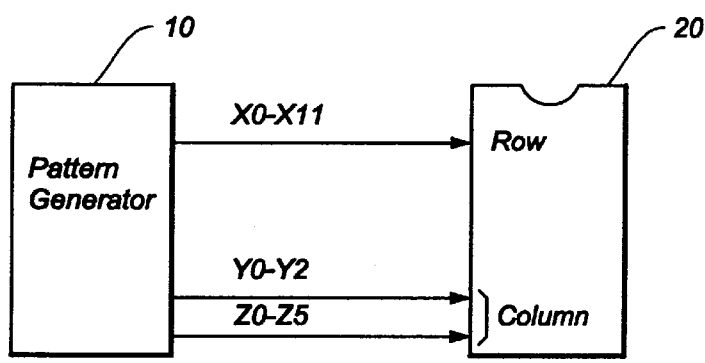
Fig.7A
| | 11 | 10 | 9 | 8 | 7 | 6 | 5 | 4 | 3 | 2 | 1 | 0 |
|---|---|---|---|---|---|---|---|---|---|---|---|---|
| Row | X11 | X10 | X9 | X8 | X7 | X6 | X5 | X4 | X3 | X2 | X1 | X0 |
Fig.7B
| | 8 | 7 | 6 | 5 | 4 | 3 | 2 | 1 | 0 |
|---|---|---|---|---|---|---|---|---|---|
| Column | Y8 | Y7 | Y6 | Y5 | Y4 | Y3 | Y2 | Y1 | Y0 |
Wrap Address

Fig.8

| Order | Start Address | Binary Counter | Sequential Type | Interleave Type |
|---|---|---|---|---|
| ↓ | 010(2) | 000(0) | 010(2) | 010(2) |
|  | 010(2) | 001(1) | 011(3) | 011(3) |
|  | 010(2) | 010(2) | 100(4) | 000(0) |
|  | 010(2) | 011(3) | 101(5) | 001(1) |
|  | 010(2) | 100(4) | 110(6) | 110(6) |
|  | 010(2) | 101(5) | 111(7) | 111(7) |
|  | 010(2) | 110(6) | 000(0) | 100(4) |
|  | 010(2) | 111(7) | 001(1) | 101(5) |

Fig. 9A

| Order | 1 → 2 → 3 → 4 → 5 → 6 → 7 → 8 |
|---|---|
| Address | 0 → 1 → 2 → 3 → 4 → 5 → 6 → 7 |
| | 1 → 2 → 3 → 4 → 5 → 6 → 7 → 0 |
| | 2 → 3 → 4 → 5 → 6 → 7 → 0 → 1 |
| | 3 → 4 → 5 → 6 → 7 → 0 → 1 → 2 |
| | 4 → 5 → 6 → 7 → 0 → 1 → 2 → 3 |
| | 5 → 6 → 7 → 0 → 1 → 2 → 3 → 4 |
| | 6 → 7 → 0 → 1 → 2 → 3 → 4 → 5 |
| | 7 → 0 → 1 → 2 → 3 → 4 → 5 → 6 |

Fig. 9B

| Order | 1 → 2 → 3 → 4 → 5 → 6 → 7 → 8 |
|---|---|
| Address | 0 → 1 → 2 → 3 → 4 → 5 → 6 → 7 |
| | 1 → 0 → 3 → 2 → 5 → 4 → 7 → 6 |
| | 2 → 3 → 0 → 1 → 6 → 7 → 4 → 5 |
| | 3 → 2 → 1 → 0 → 7 → 6 → 5 → 4 |
| | 4 → 5 → 6 → 7 → 0 → 1 → 2 → 3 |
| | 5 → 4 → 7 → 6 → 1 → 0 → 3 → 2 |
| | 6 → 7 → 4 → 5 → 2 → 3 → 0 → 1 |
| | 7 → 6 → 5 → 4 → 3 → 2 → 1 → 0 |

TEST PATTERN GENERATION APPARATUS AND METHOD FOR SDRAM

This is a continuation-in-part of U.S. patent application Ser. No. 08/894,870 filed Aug. 12, 1997 now U.S. Pat. No. 5,854,801.

FIELD OF THE INVENTION

This invention relates to a test pattern generation apparatus and method for generating a test pattern to test a semiconductor device, and more particularly, to a test pattern generation apparatus and method for applying a test pattern to a synchronous dynamic random access memory.

BACKGROUND OF THE INVENTION

A semiconductor test system is to test various types of semiconductor devices by applying test patterns to the semiconductor devices and evaluating resultant output signals from the semiconductor devices. One of the recent semiconductor memories is a synchronous dynamic random access memory (hereinafter referred to as "SDRAM") which is capable of a high speed operation in writing data therein and reading data therefrom.

An SDRAM is a memory that makes a continuous access of the certain range of addresses (memory block) possible by itself by including a special architecture for the continuous access, thereby increasing the overall speed of address access. In a typical SDRAM, a read write rate of 100M byte/sec or higher is possible. For increasing the rate of the continuous access with high speed like this, the continuous read/write of SDRAM is performed in a burst mode. The burst mode is a mode of address access in a memory wherein data in the same row address is read or written continuously for a block consisting of 2, 4, or 8 words or the like. In addition, the access for such words in the block memory is made by simply providing a start address of the block. Afterward, the remaining addresses for the block are generated automatically in the SDRAM by itself.

After receiving the start address, there are two methods for the address sequence of the burst mode; a sequential mode and an interleave mode. FIG. 8 shows an example of two types of burst mode address sequence in an SDRAM in which a burst length is 8 words. In the example of FIG. 8, the numerals in the parentheses are expressed in decimal and the start address is "2". In the sequential mode, the burst address is generated in a continuous sequence while in the interleave mode, the burst address is generated by a sequence based on an exclusive OR logic. When the start address for the continuous access block is provided to the SDRAM, the burst address for the corresponding memory block is produced by the SDRAM either by the sequential mode or the interleave mode. Whether which one of the sequential or interleave mode is used in the SDRAM is predetermined by specifications of the SDRAM in question.

FIGS. 9A and 9B further show examples of the sequential mode bust address and the interleave mode burst address, respectively. In each of the examples of FIGS. 9A and 9B, the top row represented by numerals 1–8 is the order of address generation and the lower rows show the burst address sequence expressed by decimal numbers. In FIG. 9A, eight examples of sequential mode burst address are shown, each of which starts at the start address at the left end. Similarly, in FIG. 9B, eight examples of interleave mode burst address are shown, each of which starts at the start address at the left end.

As noted above, once a start address is received, an SDRAM continuously produces a certain length of wrap address for accessing the memory block therein. In testing such an SDRAM by a semiconductor test system, the same burst address must be generated by the test system for accessing a fail memory to store the test results therein. The test results in the fail memory is used in a failure analysis process of the SDRAM following the test. Thus, the semiconductor test system not only generates start addresses for the SDRAM but also generates the same burst mode address produced in the SDI?AM to be provided to the fail memory.

FIGS. 7A and 7B show an example of address bit allocations at the output of the pattern generator for testing the SDRAM. In this example, a row address of FIG. 7A is produced in the same manner as the row addresses for ordinary memory devices. In FIG. 7B, a part of the column address of the SDRAM is used for generating the burst address. Namely, a set of three LSB (least significant bit) Y0, Y1, Y2 is assigned to produce the predetermined burst address for the memory block in the SDRAM.

FIG. 6 shows an example of pattern generation for testing an SDRAM in the conventional semiconductor test system. This example shows the relationship between the address of the SDRAM 20 to be tested and the corresponding address bits from a pattern generator 10. In this example, the address X0-X11 of the pattern generator is allocated to the row address of the SDRAM. The address Y0–Y2 of the pattern generator 10 is allocated to the burst address for the SDRAM. For the rest of column address of the SDRAM, the address Z0–Z5 of the pattern generator is assigned.

In the pattern generator of the conventional semiconductor test system, it is not possible to generate a complex test pattern including the burst address such as the sequential mode or interleave mode for testing the SDRAM. This is because the standard type semiconductor test system does not include an enough operational ability in the pattern generator to cover the complexity involved in the burst address generation for SDRAMs. Thus, for generating such patterns, it is necessary to pre-install a complex pattern program produced by a mathematical process. In addition to the complexity, in the conventional technology, there is a problem that a start column address for the burst mode operation cannot be produced through an algorithmic procedure.

SUMMARY OF THE INVENTION

Therefore, it is an object of the present invention to provide a test pattern generation apparatus and method for generating a test pattern to test a synchronous dynamic random access memory (SDRAM).

It is another object of the present invention to provide a test pattern generation apparatus which can easily generate test patterns for testing an SDRAM by adding a wrap address conversion circuit.

It is a further object of the present invention to provide a test pattern generation method for testing an SDRAM by converting address data from the pattern generator to the burst address of predetermined modes.

According to the first embodiment of the present invention, a test pattern generation apparatus is provided to effectively test an SDRAM. The pattern generation apparatus includes a wrap address conversion means which is provided with two (2) kinds of address data (Y0–Y2) and (Z0–Z2) from a pattern generator and outputs burst address which have been converted based on a predetermined logic circuit information in the conversion means.

When two kinds of input address data (Y0–Y2) and (Z0–Z2) are given to the wrap address conversion means, the conversion means outputs the burst address (Y00–Y02) expressed by the following logic equations based on the logic circuit information therein:

Y00=Y0. XOR. Z0
Y01=Y1. XOR. Z1
Y02=Y2. XOR. Z2

Alternatively, when the two kinds of input address data (Y0–Y2) and (Z0–Z2) are given to the wrap address conversion means, the conversion means outputs the burst address (Y00–Y02) expressed by the following logic equations based on the logic circuit information therein:

Y00=Y0. XOR. Z0
Y01=(Y0. AND. Z0). XOR. (Y1. XOR. Z1)
Y02=(((Y0. AND. Z0). AND. (Y1. XOR. Z1)). OR. (Y1. AND. Z1)). XOR. (Y2. XOR. Z2)

In the second embodiment, a test pattern generation method is provided for testing the SDRAM. The test pattern generation method for testing the SDRAM is comprised of the steps of:

inputting column address data (Y0–Y2) from the pattern generator to a wrap address conversion circuit;
inputting wrap address data (Z0–Z2) from the pattern generator to the wrap address conversion circuit;
outputting a converted address (Y00–Y02) from the wrap address conversion circuit based on the following logic equations;
Y00=Y0. XOR. Z0
Y01=Y1. XOR. Z1
Y02=Y2. XOR. Z2.

Further, after the logic conversion step of the above, a conversion step of an address inverse scramble step can be added to the output of the logic conversion.

Alternatively, a test pattern generation method for testing the SDRAM is comprised of the steps of:

inputting column address data (Y0–Y2) from the pattern generator to a wrap address conversion circuit;
inputting wrap address data (Z0–Z2) from the pattern generator to the wrap address conversion circuit;
outputting a converted address (Y00–Y02) from the wrap address conversion circuit based on the following logic equations;
Y00=Y0. XOR. Z0
Y01=(Y0. AND. Z0). XOR. (Y1. XOR. Z1)
Y02=(((Y0. AND. Z0). AND. (Y1. XOR. Z1)). OR. (Y1. AND. Z1)). XOR. (Y2. XOR. Z2).

Further, after the logic conversion of the above, a conversion step of an address inverse scramble can be added to the output of the logic conversion.

According to the present invention, a pattern program used in the pattern generator is not complicated and can be easily produced. Further, the pattern program in the pattern generator can be commonly used in generating the burst address between the sequential mode bust address and the interleave mode burst address because the pattern program expressed by an ordinary incremental form can be applied to the wrap conversion circuit.

BRIEF DESCRIPTION OF THE DRAWINGS

FIG. 5 is a block diagram showing an example of circuit configuration of the present invention in which both the address scramble function and the wrap address conversion function for the SDRAM are included.

FIG. 6 is a block diagram showing an example of pattern generation in the conventional semiconductor test system.

FIGS. 7A and 7B are schematic diagrams showing an example of address allocation for generating a burst address in the conventional technology.

FIG. 8 shows an example of the address sequences including a sequential mode and an interleave mode for testing an SDRAM.

FIGS. 9A and 9B show examples of sequential mode burst address and interleave mode burst address, respectively, expressed by decimal numbers.

DETAILED DESCRIPTION OF THE PREFERRED EMBODIMENT

Figures 1, 2A, 2B:
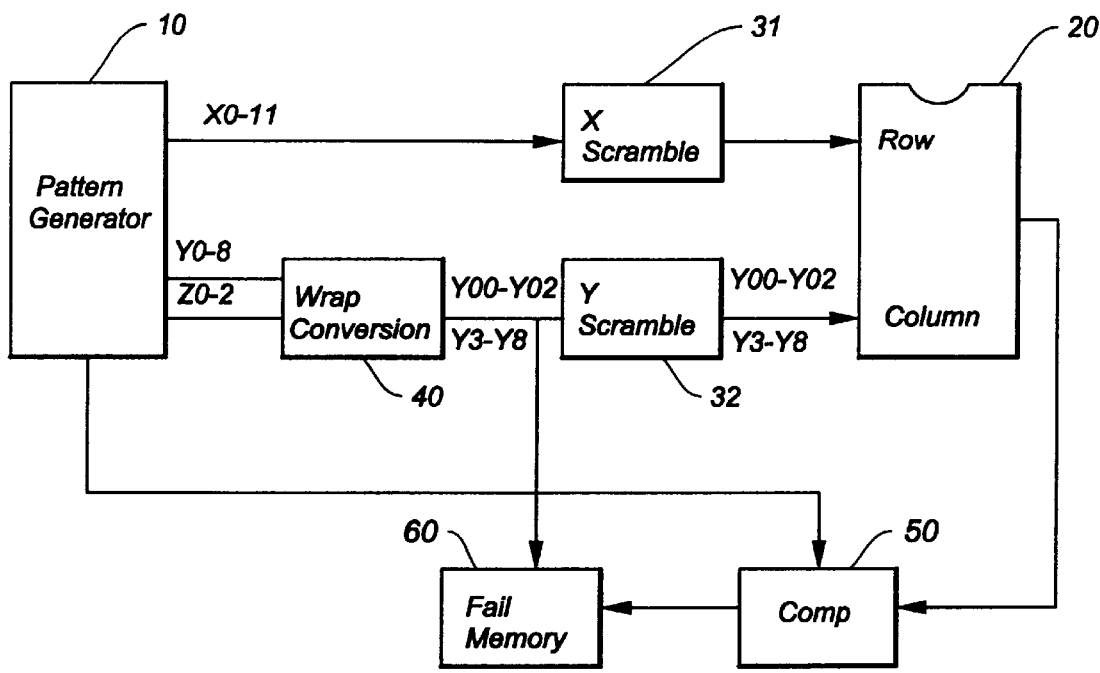
FIG. 1 is a block diagram showing the embodiment of a pattern generator in the present invention.
FIGS. 2A and 2B are schematic diagrams showing an example of pattern generation for the row and column addresses for testing an SDRAM in the present invention.

The first embodiment of the present invention is explained with reference to the drawings. FIG. 1 is a block diagram showing the first embodiment of the present invention. As shown in FIG. 1, a wrap address conversion circuit 40 is provided at an output of a pattern generator 10. The block diagram of FIG. 1 also shows a comparator 50 and a fail memory 60. The comparator 50 is provided with output signals from an IC device which is an SDRAM 20 under test to compare with expected data from the pattern generator 10. The fail memory 60 is to store the comparison results from the comparator 50 in addresses corresponding to the memory cells in the SDRAM 20.

For the wrap address conversion circuit 40, address data (Y0–Y8) corresponding to the bit length of the column address of the SDRAM is provided from the pattern generator 10. At the same time, data (Z0–Z2) corresponding to the bit length of the burst address of the SDRAM is provided to the wrap address conversion circuit 40 from the pattern generator 10. The wrap address conversion circuit 40 produces the burst address including the start address of the block memory in the SDRAM as well as either the sequential or interleave mode burst address.

As noted above, an SDRAM produces address data in the burst method for a predetermined memory block therein by its internal operation to attain a high speed operation. The semiconductor test system is required to produce the same address data as that internally produced by the SDRAM to store the test results in the corresponding addresses in the fail memory 60. Thus, the burst address produced by the wrap address conversion circuit 40 is also provided to the fail memory 60.

FIG. 2 is a schematic diagram showing an example of pattern generation for the row and column addresses of the SDRAM 20 in the present invention. According to the address conversion described above, the resultant address that corresponds to the address sequence shown in FIG. 8 or FIGS. 3B and 4B can be obtained by only incrementing the address data Z. Hence, when the data Z0–Z2 changes in the order of address sequence of the SDRAM, each output corresponding to the sequential mode burst address or interleave mode burst address can be obtained as the output data Y00–Y02. Further, the start column address in the burst address can be set through an algorithmic process. The output of this wrap conversion circuit 40 is given to the device SDRAM 20 to be tested. Further, the output of the wrap conversion circuit 40 is provided to the fail memory 60 as shown in FIG. 1.

Figures 3A, 3B:
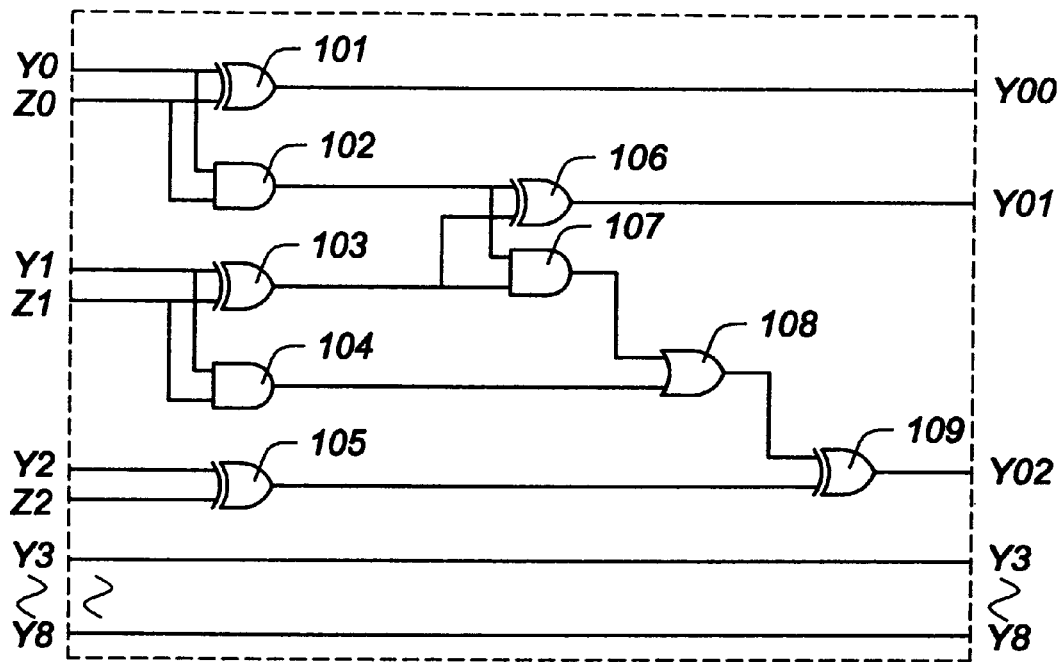
FIG. 3A is a circuit diagram showing a circuit structure in the wrap address conversion circuit of the present invention for a sequential mode burst address.
FIG. 3B is a truth table showing an operation of the address conversion circuit of FIG. 3A for generating the sequential mode burst address.

An example of internal logic structure of the wrap address conversion circuit 40 is shown in FIG. 3A for the sequential mode burst address. The wrap address conversion circuit 40 is formed with a set of gates, which is consisting of exclusive OR gates 101, 103, 105, 106 and 109, AND gates 102, 104 and 107 and an OR gate 108. In the wrap address conversion circuit 40, the data Y provided from the pattern generator 10 is converted to the address of the interleave mode burst address by using the data Z, and the resultant address is input to the SDRAM under test. In the wrap address conversion circuit 40, the following logic circuit information is set for the address conversion;

Y00=Y0. XOR. Z0
Y01=(Y0. AND. Z0). XOR. (Y1. XOR. Z1)
Y02=(((Y0. AND. Z0). AND. (Y1. XOR. Z1)). OR. (Y1. AND. Z1)). XOR. (Y2. XOR. Z2).

The logic circuit information in the conversion circuit 40 can be formed by a software process and can be freely renewed by instructions from outside sources. In addition, the above address data Z can be the data generated by the pattern generator which is incremented by one.

FIG. 3B is a truth table showing an operation of the address conversion circuit of FIG. 3A for generating the sequential mode burst address. The truth table of FIG. 3B shows the situation where the start address of the memory block of the SDRAM is "2" in decimal notation. Each logic of the input addresses Y0–Y2 and Z0–Z2 to the conversion circuit 40 is shown in the "In" block of the table while each logic of the output address Y00–Y02 is shown in the "Out" block of the table. The truth table also shows logic status of each of the gates 101–109 in the "Gate" block.

Figures 4A, 4B:
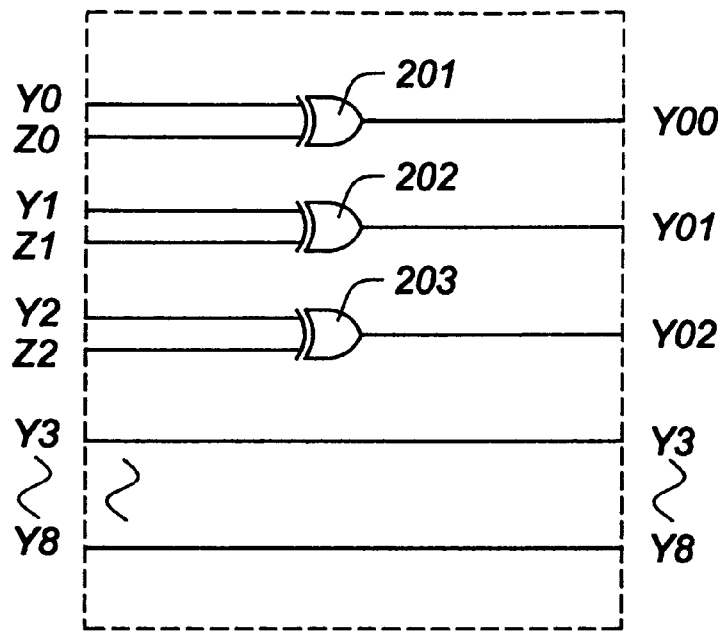
FIG. 4A is a circuit diagram showing a circuit structure in the wrap address conversion circuit of the present invention for an interleave mode burst address.
FIG. 4B is a truth table showing an operation of the address conversion circuit of FIG. 4A for generating the interleave mode burst address.

An example of internal logic structure of the wrap address conversion circuit 40 is shown in FIG. 4A for the interleave mode burst address. The wrap address conversion circuit 40 is formed with exclusive OR gates 201–203. In the wrap address conversion circuit 40, the data Y provided from the pattern generator 10 is converted to the address of the interleave address mode by using the data Z, and the resultant address is input to the SDRAM 20 under test. In the wrap address conversion circuit 40, the following logic circuit information is set for the address conversion;

Y00=Y0. XOR. Z0
Y01=Y1. XOR. Z1
Y02=Y2. XOR. Z2

FIG. 4B is a truth table showing an operation of the address conversion circuit of FIG. 4A for generating the interleave mode burst address. The truth table of FIG. 4B shows the situation where the start address of the memory block of the SDRAM is "2" in decimal notation. Each logic of the input addresses Y0–Y2 and Z0–Z2 to the conversion circuit 40 is shown in the "In" block of the table while each logic of the output address Y00–Y02 is shown in the "Out" block of the table. The truth table also shows logic status of each of the gates 201–203 in the "Gate" block.

The second embodiment of the present invention is explained with reference to the drawings. The second embodiment is directed to a case where an address inversion scramble is incorporated between the pattern generator 10 and the SDRAM 20 to be tested. The address inversion scramble is used for converting the address between the logical address and the physical address of the device under test. This is a function to convert the address because the chip alignment within an IC device is freely designed and determined to meet the physical and operational conditions of the device for each kind of devices and such an alignment does not match the logical address given at the outside of the device. Thus, the address inversion scramble is a function necessary to perform failure analysis with respect to the internal operation of the device under test.

When both of the address inversion scramble function and the wrap conversion for testing the SDRAM are to be used, an X scramble memory 31 is provided between the pattern generator 10 and the IC device 20 to be tested as an address scrambler of the row address as shown in FIG. 1. Further, as an address scrambler of the column address, a Y scramble memory 32 is provided between the wrap converter 40 and the IC device 20 to be tested.

The third embodiment of the present invention is explained with reference to the drawings. When both of the address inversion scramble function and the wrap conversion operation for testing the SDRAM are to be used, the present invention can be configured as shown in FIG. 5. In this example, the internal logic structure of the Y scramble memory 32 is formed of a combination of the logic circuit information for the sequential address mode of FIG. 3 and the logic circuit information for the scramble conversion. Further, the internal logic structure of the Y scramble memory 32 can be formed of a combination of the logic circuit information for the interleave address mode of FIG. 4 and the logic circuit information for the scramble conversion. In this case, however, a signal for separating the wrap conversion circuit from the scramble circuit cannot be taken out, and thus, a signal for failure analysis cannot be obtained. In the above embodiment, the wrap conversion function is performed in the Y scramble memory. However, it is also possible to include the wrap conversion function in the X scramble memory as well.

For each embodiment described above, the explanation is made for the case that the length of wrap address is 3 bits. However, an arbitrary bit length for the addresses of Y0–Yn and Z0–Zn can be used within the concept of the present invention.

Because of the configuration described above, a pattern program used in the pattern generator is not complicated and can be easily produced. Further, the pattern program can be commonly used in generating the wrap address between the sequential type and the interleave type because the pattern program in the pattern generator expressed by an ordinary incremental form can be applied to the wrap conversion circuit. As a consequence, the present invention is also effective to prevent errors in the coding or program production process.

Although only preferred embodiments are specifically illustrated and described herein, it will be appreciated that many modifications and variations of the present invention are possible in light of the above teachings and within the purview of the appended claims without departing the spirit and intended scope of the invention.

What is claimed is:

1. A test pattern generation apparatus for generating a test pattern to test a synchronous dynamic random access memory (SDRAM) comprising:

a pattern generator for generating a test pattern and an expected value pattern, the test pattern including row and column address data; and a wrap conversion circuit which receives two types of the column address data from the pattern generator and converts the received address data to a bust mode address based on a predetermined logic circuit information therein.

2. A test pattern generation apparatus for an SDRAM as defined in claim 1, wherein the logic circuit information in the wrap conversion circuit is formed in such a way that:

an output (Y00–Y02) of the wrap conversion circuit is converted to the burst mode address as expressed in the following when the two types of the column address data (Y0–Yn and Z0–Zn) are given;
Y00=Y0. XOR. Z0
Y01=Y1. XOR. Z1
Y02=Y2. XOR. Z2.

3. A test pattern generation apparatus for an SDRAM as defined in claim 1, wherein the logic circuit information in the wrap conversion circuit is formed in such a way that:

an output (Y00–Y02) of the wrap conversion circuit is converted to the burst mode address as expressed in the following when the two types of the column address data (Y0–Yn and Z0–Zn) are given;
Y0=Y0. XOR. Z0
Y1=(Y0. AND. Z0). XOR. (Y1. XOR. Z1)
Y2=(((Y0. AND. Z0). AND. (Y1. XOR. Z1)). OR. (Y1. AND. Z1)). XOR. (Y2. XOR. Z2).

4. A test pattern generation apparatus as defined in claim 1, wherein the burst mode address includes a sequential mode address in which a burst address is generated in a continuous sequence, and an interleave mode address in which a burst address is generated by a sequence of an exclusive OR logic.

5. A test pattern generation method for generating a test pattern to test a synchronous dynamic RAM (SDRAM) comprising the steps of:

applying a column address data from a pattern generator to an SDRAM under test;

inputting row address data (Y0–Y2) from the pattern generator to a wrap address conversion circuit;

inputting wrap address data (Z0–Z2) from the pattern generator to the wrap address conversion circuit;

outputting an address (Y00–Y02) converted to a burst mode address from the wrap address conversion circuit based on the following logic equations;
Y00=Y0. XOR. Z0
Y01=Y1. XOR. Z1
Y02=Y2. XOR. Z2 applying the address (Y00–Y02) from the wrap address conversion circuit to the SDRAM under test.

6. A test pattern generation apparatus as defined in claim 5, wherein the burst mode address includes a sequential mode address in which a burst address is generated in a continuous sequence, and an interleave mode address in which a burst address is generated by a sequence of an exclusive OR logic.

7. A test pattern generation method for generating a test pattern to test a synchronous dynamic RAM (SDRAM) comprising the steps of:

applying a column address data from a pattern generator to an SDRAM under test;

inputting row address data (Y0–Y2) from a pattern generator to a wrap address conversion circuit;

inputting wrap address data (Z0–Z2) from the pattern generator to the wrap address conversion circuit;

outputting an address (Y00–Y02) converted to a burst mode address from the wrap address conversion circuit based on the following logic equations;
Y00=Y0. XOR. Z0
Y01=(Y0. AND. Z0). XOR. (Y1. XOR. Z1)
Y02=(((Y0. AND. Z0). AND. (Y1. XOR. Z1)). OR. (Y1. AND. Z1)). XOR. (Y2. XOR. Z2).

applying the address (Y00–Y02) from the wrap address conversion circuit to the SDRAM under test.

8. A test pattern generation apparatus as defined in claim 7, wherein the burst mode address includes a sequential mode address in which a burst address is generated in a continuous sequence, and an interleave mode address in which a burst address is generated by a sequence of an exclusive OR logic.

9. A test pattern generation method for SDRAM as defined in claim 5, further comprising a step of an address inversion scramble operation which is performed for the burst mode address received from the wrap address conversion circuit.

10. A test pattern generation method for SDRAM as defined in claim 7, further comprising a step of an address inversion scramble operation which is performed for the burst mode address received from the wrap address conversion circuit.

* * * * *